United States Patent [19]
Lu et al.

[11] Patent Number: 5,837,584
[45] Date of Patent: Nov. 17, 1998

[54] VIRTUAL GROUND FLASH CELL WITH ASYMMETRICALLY PLACED SOURCE AND DRAIN AND METHOD OF FABRICATION

[75] Inventors: Wenpin Lu, I-Lan; Mam-Tsung Wang, Hsinchu, both of Taiwan

[73] Assignee: Macronix International Co., Ltd., Hsinchu, Taiwan

[21] Appl. No.: 783,994

[22] Filed: Jan. 15, 1997

[51] Int. Cl.$^6$ .............................................. H01L 21/8247
[52] U.S. Cl. .......................................... 438/263; 438/286
[58] Field of Search .................................. 438/257, 262, 438/263, 286, 595

[56] References Cited

U.S. PATENT DOCUMENTS

| | | | |
|---|---|---|---|
| 4,852,062 | 7/1989 | Baker et al. | 438/286 |
| 5,102,814 | 4/1992 | Woo | 437/43 |
| 5,306,658 | 4/1994 | Gill | 438/286 |
| 5,480,819 | 1/1996 | Huang | 438/263 |
| 5,510,284 | 4/1996 | Yamauchi | 438/286 |

FOREIGN PATENT DOCUMENTS 0 752 721 A2   8/1997   European Pat. Off. .

OTHER PUBLICATIONS

Noriyuki, S., "Semiconductor Memory Device and Drive System Therefor", Patent Abstracts of Japan, vol. 018, No. 545, Publ. No. 06196713, 15 Jul. 1994.

Ohi, M. et al., "An Asymmetrical Offset Source/Drain Structure for Virtual Ground Array Flash Memory with DINOR Operation", Digest of Technical Papers of the Symposium on VLSI Technology, Kyoto, May 17–19, 1993, IEEE, pp. 57–58.

Yamauchi, Y. et al., "A New Cell Structure for Sub–quarter Micron High Density Flash Memory", Technical Digest of the International Electron Devices Meeting, Washington, Dec. 10–13, 1995, IEEE, pp. 267–270.

*Primary Examiner*—Chandra Chaudhari
*Attorney, Agent, or Firm*—Wilson Sonsini Goodrich & Rosati; Mark A. Haynes; Charles C. Cary

[57] ABSTRACT

A memory cell having asymmetrically placed source and drain diffusions which allows programming and erasure to be obtained across one of the source or drain diffusions which extends furthest beneath the floating gate while minimizing electron tunneling at the other of the source or drain diffusions which extends only minimally beneath the floating gate. A nonvolatile semiconductor memory device comprising row and column arrangement of the cells in which adjacent columns of cells share a single virtual ground bit-line. The method for manufacturing a memory cell having asymmetric source and drain regions and comprising the steps of (1) forming a dielectric covering a semiconductor substrate of a first conductivity type; (2) forming a first and second column of floating gate cores on the dielectric; (3) implanting a first dopant adjacent the second column and displaced from the first column, the first dopant having a second conductivity type opposite the first conductivity type; (4) forming floating gate sidewalls in contact with the floating gate cores; (5) implanting a second dopant between the floating gate sidewalls, the second dopant having the second conductivity type; (6) forming a thermal oxide between the first and second column of floating gate cores such that oxide encroachments are formed below the floating gate cores of the first and second column and the first dopant is separated from the second column of floating gate cores by the first dielectric and the second dopant is separated from first column of the floating gate cores by the oxide encroachment; and (7) completing formation of control gate dielectric and control gates. The presence of tunneling and non-tunneling connections on the source and drain side of each cell improves the isolation between adjacent memory cells and minimizes the disturb problem.

6 Claims, 9 Drawing Sheets

VIRTUAL GROUND FLASH CELL WITH ASYMMETRICALLY PLACED SOURCE AND DRAIN AND METHOD OF FABRICATION

RELATED APPLICATION DATA

The present application is related to An Asymmetric Bird's Beak Cell For A Flash EEPROM And A Manufacturing Method Therefor, Application No. 08/783,995, Attorney Docket No. 17538.858, filed on Jan. 15, 1997, which is incorporated by reference as if fully set forth herein.

BACKGROUND OF THE INVENTION

1. Field of the Invention

The field of the present invention relates to a nonvolatile semiconductor memory device and a manufacturing method therefor, and more particularly to an electrically programmable metal-oxide-semiconductor (MOS) type nonvolatile semiconductor memory device having an asymmetrically placed source and drain.

2. Description of Related Art

Flash memories are a growing class of nonvolatile storage integrated circuits. Flash memories have the capability of electrically erasing, programming, and reading a memory cell in the chip. A flash memory cell is formed using so-called floating gate transistors in which the data is stored in a cell by charging or discharging the floating gate. The floating gate is a conductive material, typically polysilicon, which is insulated from the channel of the transistor by a thin layer of oxide, or other insulating material, and insulated from the control gate or word-line of the transistor by a second layer of insulating material.

Data is stored in the memory cell by charging or discharging the floating gate. The floating gate is charged through a Fowler-Nordheim (FN) tunneling mechanism by establishing a large positive voltage between the gate and source or drain. This causes electrons to be injected into the floating gate through the thin insulator. Alternatively, an avalanche injection mechanism may be used by applying potentials to induce high energy electrons in the channel of the cell which are injected across the insulator to the floating gate. When the floating gate is charged, the threshold voltage for causing the memory cell channel to conduct is increased above the voltage applied to the word-line during a read operation. Thus, when a charged cell is addressed during a read operation, the cell does not conduct. The non-conducting state of the cell can be interpreted as a binary 1 or 0 depending on the polarity of the sensing circuitry.

The floating gate is discharged to establish the opposite memory state. This function is typically carried out by FN tunneling between the floating gate and the source or the drain of the transistor, or between the floating gate and the substrate. For instance, the floating gate may be discharged through the source by establishing a large positive voltage from the source to the gate, while the drain is left at a floating potential.

A popular architecture for flash memories is the virtual ground bit-line structure. In a virtual ground architecture, the transistors of adjacent memory cell columns share a bit-line between the sources of the transistors of one of the columns and the drains of the transistors of the other of the adjacent columns. The need for a dedicated pair of bit-lines per column is eliminated. Any memory cell in the array can be programmed or read by application of appropriate voltages to the word-line and the bit-lines connected to it. In particular, the state of an addressed memory cell can be determined by sensing the current flowing through its source and drain by means the bit-lines connected thereto. To further reduce the area required by the source and drain bit-lines, they can be implemented as buried diffusion bit-lines.

A drawback to buried bit-line virtual ground architectures in flash memory is the problem of an undesired disturb/program of an adjacent cell due to sharing a bit-line and a word-line with a cell being programmed or read. During programming of a cell, an adjacent cell may be susceptible to FN tunneling or hot electron injection. This results in an unacceptable memory loss. During a read of a cell, an adjacent cell may experience a leakage current, which will degrade the readout characteristic of the cell. The conventional approach to the disturb problem is to asymmetrically dope the source and drain of each transistor. This asymmetric doping does help the disturb problem, but has the drawback of increasing bit-line resistance. The increase in bit-line resistance in turn adversely affects the conductivity of the bit-lines, the power consumption and speed of the memory array.

The major challenge of flash memory design is to improve programming speed while maintaining disturb resistance. To realize further reductions in array size, new solutions to the disturb problem that do not involve increasing the bit-line resistance need to be found.

SUMMARY OF THE INVENTION

The present invention provides a nonvolatile semiconductor memory device and a manufacturing method therefor. A memory cell is disclosed in which asymmetrically placed source and drain regions in a semiconductor substrate are aligned with a floating gate core above the semiconductor substrate. On the source side of the cell, the source diffusion does not extend beyond a thermal oxide encroachment and therefore is separated from the floating gate core by the thick oxide of the encroachment. The thick oxide minimizes electron tunneling on the source side. On the drain side, the drain diffusion does extend beyond the thermal oxide encroachment and therefore is separated from the floating gate core by a thin tunneling dielectric. Electron tunneling from the drain diffusion to the floating gate is unimpaired. As a result of the asymmetric placement of the source and drain diffusions, the average dopant density of the source and drain diffusions is greater than in conventional asymmetrical doped cells. The memory is capable of affecting the programming, erasing and read operations of a memory cell, while reducing disturbance of a cell adjacent to the one being programmed, erased or read.

In order to achieve the foregoing, a memory is provided on a semiconductor substrate. A dielectric is provided on the semiconductor substrate. A floating gate core comprising a first and a second side is provided on the dielectric. A thermal oxide region is provided on the semiconductor substrate adjacent the first and second sides of the floating gate core. The thermal oxide region has symmetric encroachments into the dielectric on the first and second sides of the floating gate core. A first diffusion region is aligned with the first side of the floating gate core and extends toward the second side of the floating gate core and beyond the symmetric encroachment. The first diffusion region is separated from the floating gate core by the first dielectric. A second diffusion region is aligned with the second side of the floating gate core and is separated from the floating gate core by the symmetric encroachment.

In a more general embodiment of the invention, a plurality of virtual ground bit-lines link adjacent columns of memory cells in a memory array, laid out as rows and columns of memory cells. Each memory cell comprises a single floating gate transistor. A first dielectric is provided on the semiconductor substrate. An array of floating gate cores arranged in columns and rows are provided on the dielectric. A plurality of thermal oxide formations are provided on the semiconductor substrate between a corresponding first and second columns of floating gate cores. The thermal oxide forms symmetric encroachments into the dielectric below the first and second columns. A plurality of first diffusion regions are aligned on a first side between the first and second columns, and extending to a second side beneath the symmetric encroachment below the second column. The plurality of first diffusion regions are separated from the array of floating gate cores of the second column by the dielectric. A plurality of second diffusion regions are aligned on a first side between the first and second columns and extend to a second side beneath the symmetric encroachment below the first column. The plurality of second diffusion regions are separated from the array of floating gate cores of the first column by the symmetric encroachment below the first column. An isolation layer is provided on the array of floating gate cores. A plurality of word-lines conductors are provided on each of the rows of the array of floating gate cores. The word-lines conductors are separated from the array of floating gate cores by an isolation layer. The word-lines and cores form a plurality of rows of floating gate transistors. A plurality of select circuits contact the wordline conductors and diffusions. The select circuits switch current to a word-line conductor and a selected pair of the first and second diffusion regions to program, erase, and read a selected floating gate transistor. By providing adjacent cells with an asymmetric source and drain connection to virtual ground bit-lines, a cell and array are disclosed in which the disturb condition between adjacent cells and columns of cells is substantially reduced.

Further, a manufacturing method for a nonvolatile virtual ground memory cell array having asymmetric memory cells comprises the following steps. A dielectric is formed over a semiconductor substrate of a first conductivity type. Next, first and second columns of floating gate cores are formed on the dielectric. A first dopant is then implanted along a first dopant strip. The first dopant strip is aligned next to the second column and displaced from the first column. The first dopant has a second conductivity type opposite the first conductivity type. Next, floating gate sidewalls are formed adjacent to the floating gate cores. The floating gate sidewalls define between them a second dopant strip. Then, a second dopant is implanted in the second dopant strip. The second dopant has the second conductivity type. Subsequently, a thermal oxide is formed between the first and second columns of floating gate cores. As a result of the thermal oxide formation, symmetric oxide encroachments are formed below the floating gate cores of the first and second columns. The first dopant is separated from the second column of floating gate cores by the dielectric, and the second dopant is separated from first column of the floating gate cores by the symmetric oxide encroachment. Finally, a control gate dielectric and control gates are formed to complete the memory device.

The manufacturing method of the present invention results in a memory cell which is separated from a virtual ground bit-line on one side by a thin tunneling region and on the other side by a thick oxide region resistant to tunneling. This arrangement makes the cell resistant to a disturb condition resulting from the programming of a cell which shares a word-line and bit-line. The foregoing method also provides for self-aligning dopant implants.

Other aspects and advantages of the present invention can be seen upon review of the figures, the detailed description, and the claims which follow.

DETAILED DESCRIPTION

A detailed description of the preferred embodiments of the present invention is provided with respect to the figures. A transistor suitable for use in a memory array comprising single transistor floating gate memory cells is disclosed. The transistor has an asymmetric source and drain structure, which causes one of the source or drain sides to be the electrically preferred side for programming and erasing the transistor. This feature is advantageous in memory arrays, as will be discussed in connection with FIG. 2. Unlike conventional asymmetric transistors which rely on differential dopant densities on the source and drain sides, an aspect of the current invention provides a transistor in which asymmetry results largely from diffusion placement, rather than dopant densities.

The asymmetric source and drain placement beneath the floating gate of the transistor allows programming and erasure to be obtained across one of the source or drain diffusions which extend furthest beneath the floating gate (the overlap diffusion) while minimizing electron tunneling at the other of the source or drain diffusions, which extends only minimally beneath the floating gate (the underlap diffusion). Naturally, this asymmetry could be reversed, with the result that the source side would provide a more likely path for a program and erase operations than the drain.

The bias of the transistor, as to a preferred side for programming and erase operations, is further enhanced by symmetric bird's beak encroachments formed under opposing sides of the floating gate. The overlapping diffusion extends beyond the bird's beak encroachment, to the thin tunneling oxide. Electron tunneling from the overlap diffusion to the floating gate is thus unimpaired. Conversely, the underlap diffusion does not extend beyond the bird's beak encroachment. Electron tunneling is minimized by the thick oxide of the encroachment which completely separates the underlap diffusion from the floating gate.

As a result of the asymmetric placement of the source and drain diffusions, the need for asymmetric source/drain dopant levels is reduced. As a result, a generally higher average dopant density may be used in the source and drain. Therefore, when transistors of the current invention are coupled by source and drain to a single bit-line the average dopant density and hence bit-line conductivity is higher than is the case with conventional asymmetrically doped transistors.

The transistor may be programmed and erased by any of a number of methods including, but not limited to F-N tunneling, and hot electron injection. The detrimental increase in bit-line resistance resulting from source and drain regions which have extreme asymmetry in doping profiles is not required. The asymmetric transistor of the current invention increases floating gate memory array density and programming speed while reducing the likelihood of a disturb condition.

A Cell with Overlap and Underlap Diffusions

Figure 1:
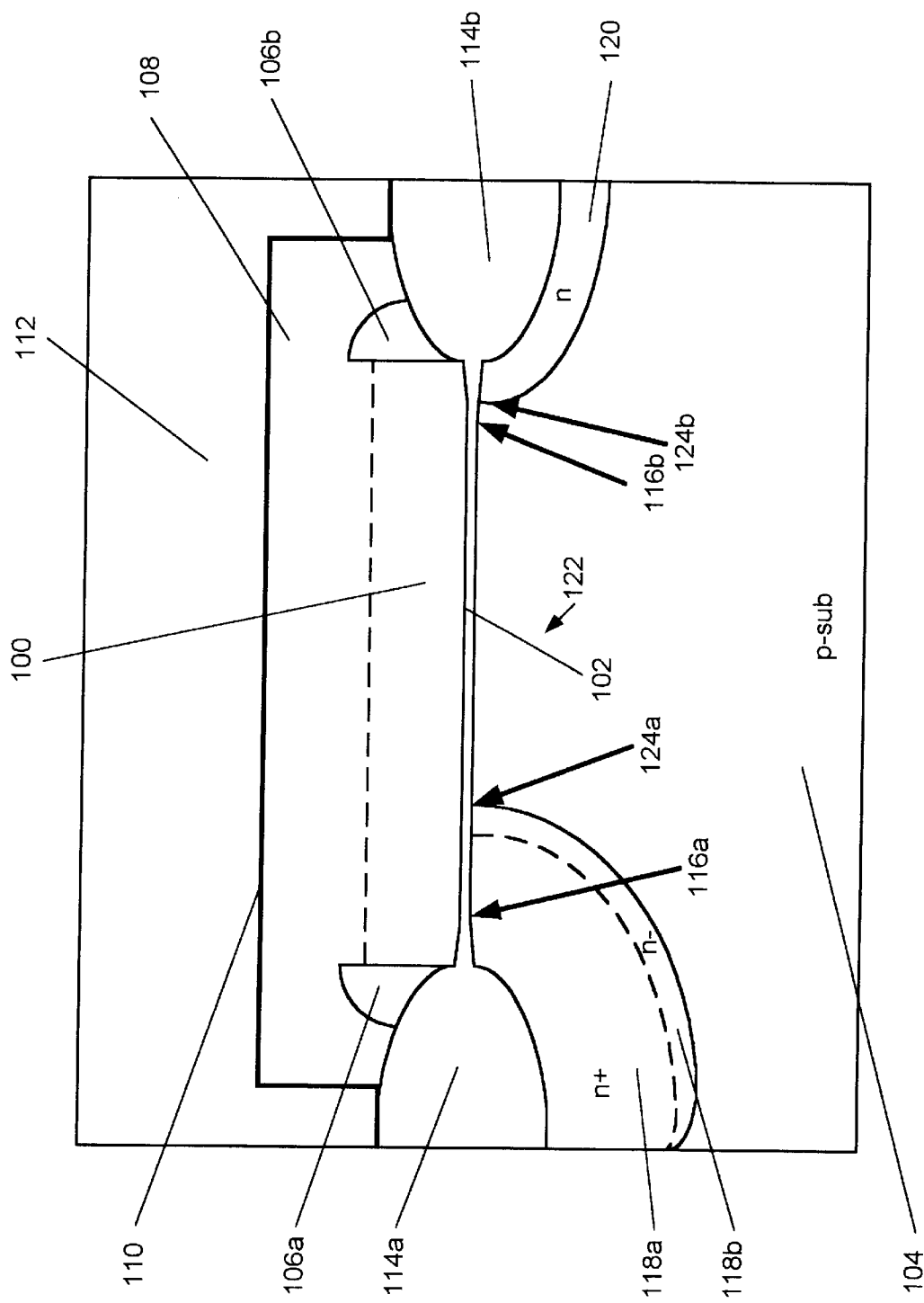
FIG. 1 is an elevation view of a first embodiment of an asymmetric floating gate memory cell.

FIG. 1 provides a detailed cross-section of an embodiment of the transistor of the current invention having overlap/underlap source/drain diffusions. A floating gate core 100 is separated by a tunneling dielectric 102 from a p-type substrate 104. The floating gate core is located between a drain sidewall 106*a* and a source sidewall 106*b*. The sidewalls and core are covered by a coupling cap 108. The coupling cap is separated from a control gate/word-line 112 by an inter-poly dielectric 110. A field oxide 114*a*, separates the floating gate coupling cap and sidewall 106*a* from a graded drain diffusion. Field oxide 114*b* separates floating gate coupling cap and sidewall 106*b* from a source diffusion. Field oxides 114*a–b* are thermally grown and provide symmetric birds'beak encroachments 116*a–b*, below the floating gate core on the drain and source side, respectively. A channel region 122 is defined between the source and drain diffusions.

The drain diffusion is formed from an $n^+$ diffusion 118*a* and a $n^-$ diffusion 118*b*. The drain diffusions 118*a–b* both overlap the bird's beak encroachment 116*a* and extend to a thin tunneling region 124*a*. The source diffusion is a n-type dopant 120. The source diffusion underlaps 124*b* the bird's beak encroachment 116*b*. The thick oxide of the encroachment separates the whole of the source diffusion from the floating gate core and, thereby, minimizes the tunneling of electrons to and from the floating gate on the source side of the cell.

Array Architecture

Figure 2:
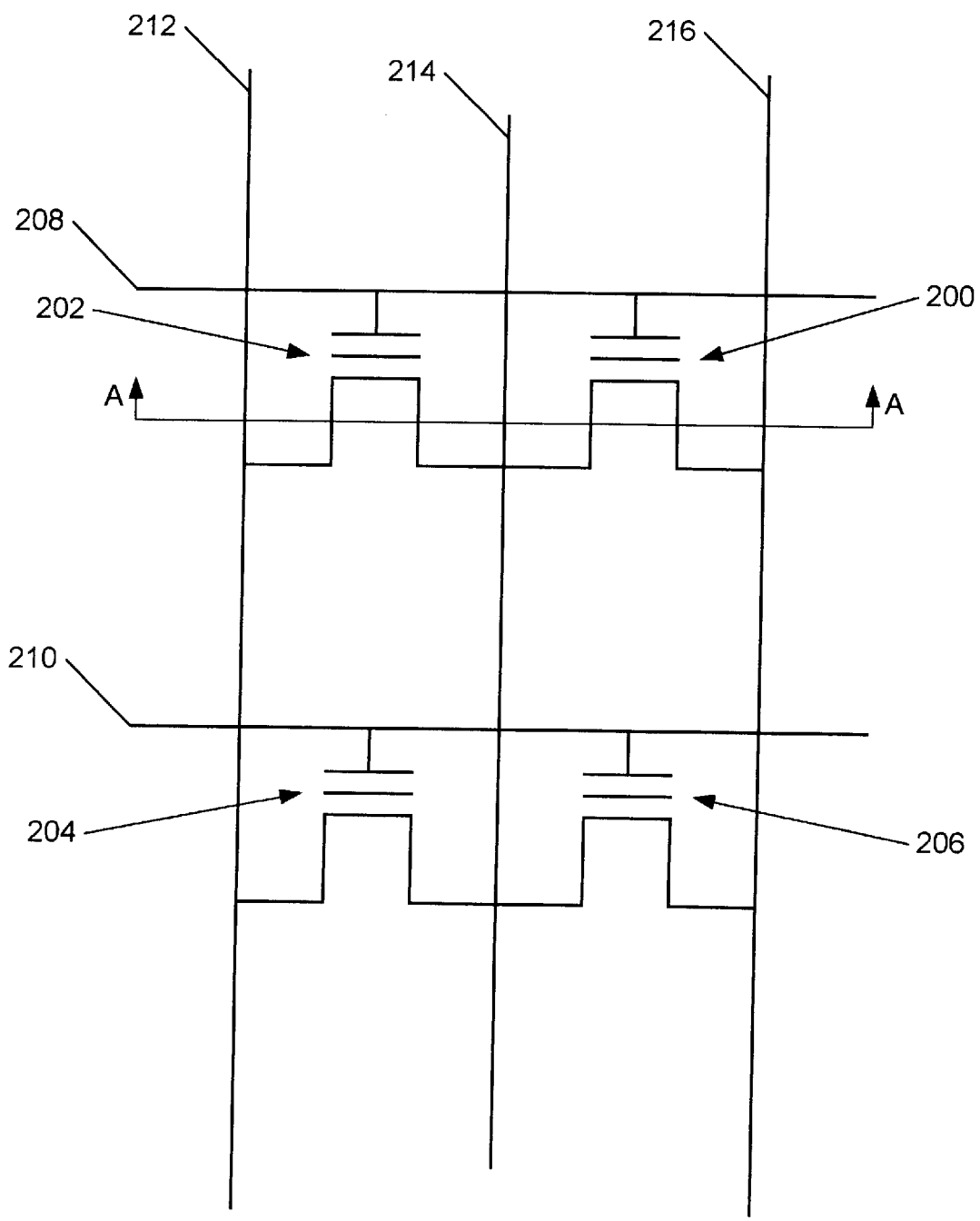
FIG. 2 is a circuit diagram of a memory array utilizing a virtual ground cell layout.

FIG. 2 is a schematic illustration of a memory array utilizing the overlap/underlap source/drain transistor of the current invention in a virtual ground architecture. In a virtual ground architecture, adjacent columns of memory cells share a source and a drain on a single bit-line. A two-dimensional array of memory cells is formed by arranging floating gate transistors 200, 202, 204, 206 into rows and columns. As depicted in FIG. 2, a right column comprises transistor 200 and 206 and a left column comprises transistor 202 and 204. The first row of the array comprises transistor 202 and 200. The second row of the array comprises transistor 204 and 206. The sources of transistors 200 and 206 are connected to a virtual ground buried diffusion bit-line 216. The drains of transistor 200 and 206 and the source of transistor 202 and 204, are connected to buried virtual ground bit-line 214. The drains of transistors 202 and 204 are connected to buried virtual ground bit-line 212. The gates of transistors 200 and 202 are connected to word-line 208. The gates of transistors 204 and 206 are connected to word-line 210.

An X–Y addressing system is affected by word-lines 208 and 210 and the rows of memory cells they select on an X-axis and the bit-lines 212–216 and the columns of memory cells they select on a Y-axis. When a memory cell such as 202 is addressed, appropriate voltages must be passed onto its drain and source by bit-lines 212 and 214, respectively, and to its control gate via word-line 208. In this manner, any cell in the array can be addressed individually for programing, erasure and read operations.

As shown in FIG. 1, each transistor is configured so that programming takes place only at the drain side and, thereby, prevents a disturb condition on a cell adjacent to one being programmed or erased. This cell structure is most advantageously used in compact memory architecture such as the buried virtual ground arrangement shown in FIG. 2.

Program Disturb

In the virtual ground architecture, such as that shown in FIG. 2, the disturb problem that arises is called a program disturb. The terminology "program disturb" refers to a decrease in floating gate charge and hence possible corruption of the bit stored in memory resulting from programming of a cell sharing a word-line and bit-line with a programmed cell. For example, when a transistor 200 is to be programmed, a negative voltage is placed on word-line 208. A positive voltage is placed on bit-line 214, which is connected to the drain of transistor 200, and bit-lines 212 and 216 are floating. Under these conditions, electrons are repelled from the floating gate of transistor 200 and are attracted to the bit-line 214. This changes the logic state, corresponding to the charge stored of the cell. The control gate of transistor 202 and transistor 200 are both connected to word-line 208. Therefore, during the program of transistor 200, the control gate of transistor 202 is also placed in a negative voltage condition. In addition, the source of transistor 202 is connected to bit-line 214 and, is therefore, placed in a positive voltage condition. If the source of transistor 202 does not provide a less favorable programming path than the drain of transistor 200, then electrons will be removed from the gate of transistor 202 during the programming of transistor 200. If sufficient charge is removed from the floating gate transistor 202 to alter the logic state corresponding to the amount of charge stored on transistor 202, then a gate disturb has taken place. However, due to the overlapping drain junction which maximizes electron tunneling and the underlapping source junction which minimizes electron tunneling, the present cell structure reduces the program disturb problem.

Conventional Virtual Ground Bit-Lines

Figure 3A:
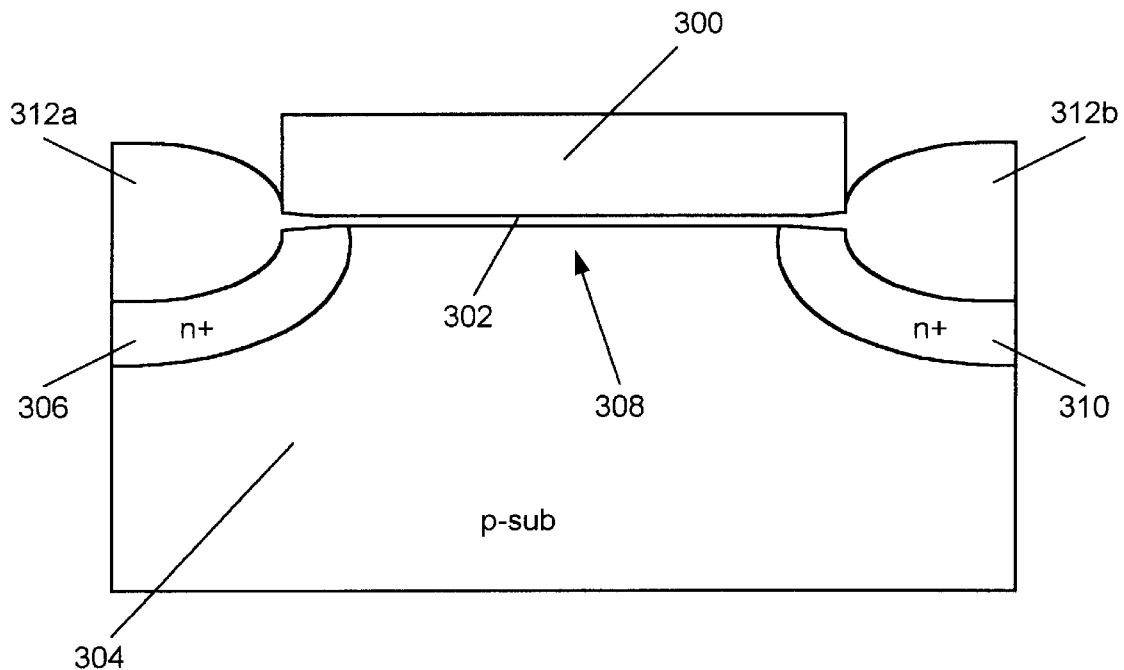
FIGS. 3A–B are partial cross-sectional elevation views illustrating conventional bit-line formation techniques.
Figure 3B:
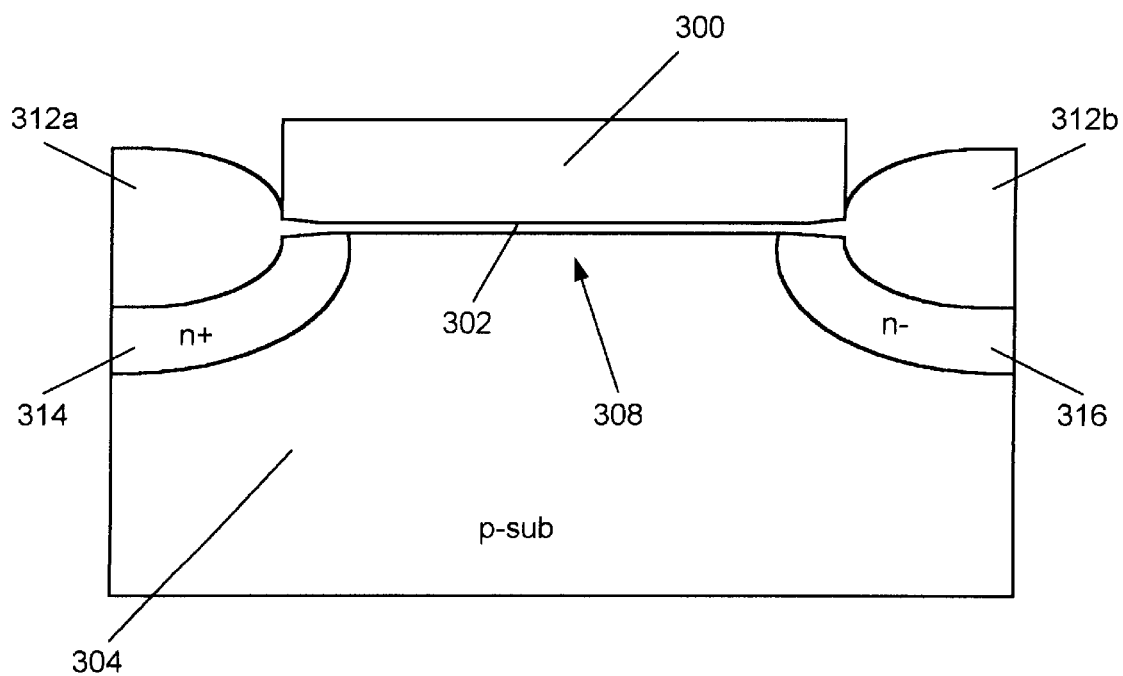

FIGS. 3A–B are partial cross-sectional views showing two conventional buried bit-line architectures. FIG. 3A depicts a cell structure having symmetric source and drain dopant diffusions of an $n^+$–type. FIG. 3B depicts a cell structure having an asymmetric dopant diffusion on the source and drain sides of the cell.

FIG. 3A is a partial cross-sectional view of a floating gate cell. Floating gate core 300 is separated from a p-type substrate 304 by a tunneling oxide 302. A channel region 308 is defined in the substrate between a buried $n^+$ source diffusion 310 and a buried $n^+$ drain diffusion 306. A thermally grown field oxide 312*a–b* is shown covering the drain and source diffusions, respectively. This cell structure will a disturb condition when utilized in a virtual ground array, because the source and drain sides provide equally favorable paths for the tunneling of electrons.

FIG. 3B is a partial cross-section of a transistor with an asymmetric source and drain dopant diffusion. Floating gate core 300 is separated from a p-type substrate 304 by a tunneling dielectric 302. Drain diffusion 314 comprises a highly doped $n^+$–type diffusion region. Source diffusion 316 comprises a lightly doped $n^-$type diffusion region. A channel region 308 is defined between the source and drain diffusions. A thermally grown field oxide 312*a–b* covers respectively the drain and source diffusion regions.

The asymmetric diffusion shown in FIG. 3B, provides a cell structure which is suitable for use in a virtual ground bit-line memory array. The disturb problem is minimized by lowering the dopant density severely on the source side of the cell, as compared to the drain side. By lowering the dopant density, the resistance to the passage of electrons is increased and a disturb problem is reduced. The drawbacks to the conventional approach to minimizing the disturb problem are that bit-line resistance and the programming time of the array are increased because of the minimal dopant density on the source side of the cell.

Manufacturing Steps for an Overlap/Underlap Transistor

Figure 4:
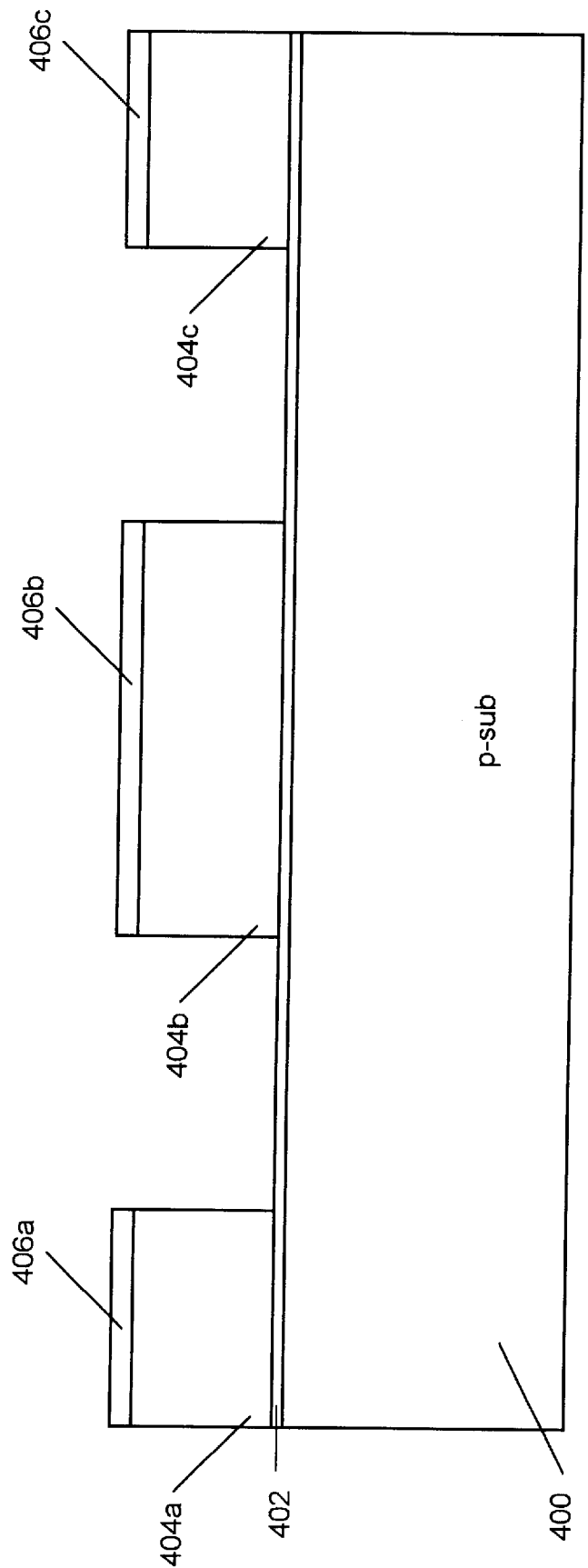
FIGS. 4–8 are cross-sectional elevation views taken at FIG. 2 (A—A) and illustrating the steps in manufacturing of memory cells having an asymmetric, overlap/underlap, source and drain.

FIGS. 4–8 are cross-sectional views taken at FIG. 2 [A—A] of a preferred embodiment for the manufacturing steps of a transistor having an asymmetrically placed source and drain. The manufacturing techniques result in a cell which has a tunneling region formed on one of the source or drain sides of the cell by an overlapping buried diffusion. The cell is fabricated using a CMOS metal, double well (one well in the array, a second well for the peripheral circuitry), and double poly technology. FIG. 4 illustrates the initial formation steps. After a $V_t$ adjustment, a tunneling oxide 402 is grown on a p-type substrate 400. Next, a poly silicon layer is deposited on the tunneling oxide. Then a silicon nitride layer is deposited. The structure is masked and patterned to define poly silicon floating gate strips 404a–c and respective silicon nitride caps 406a–c, respectively.

Figure 5:
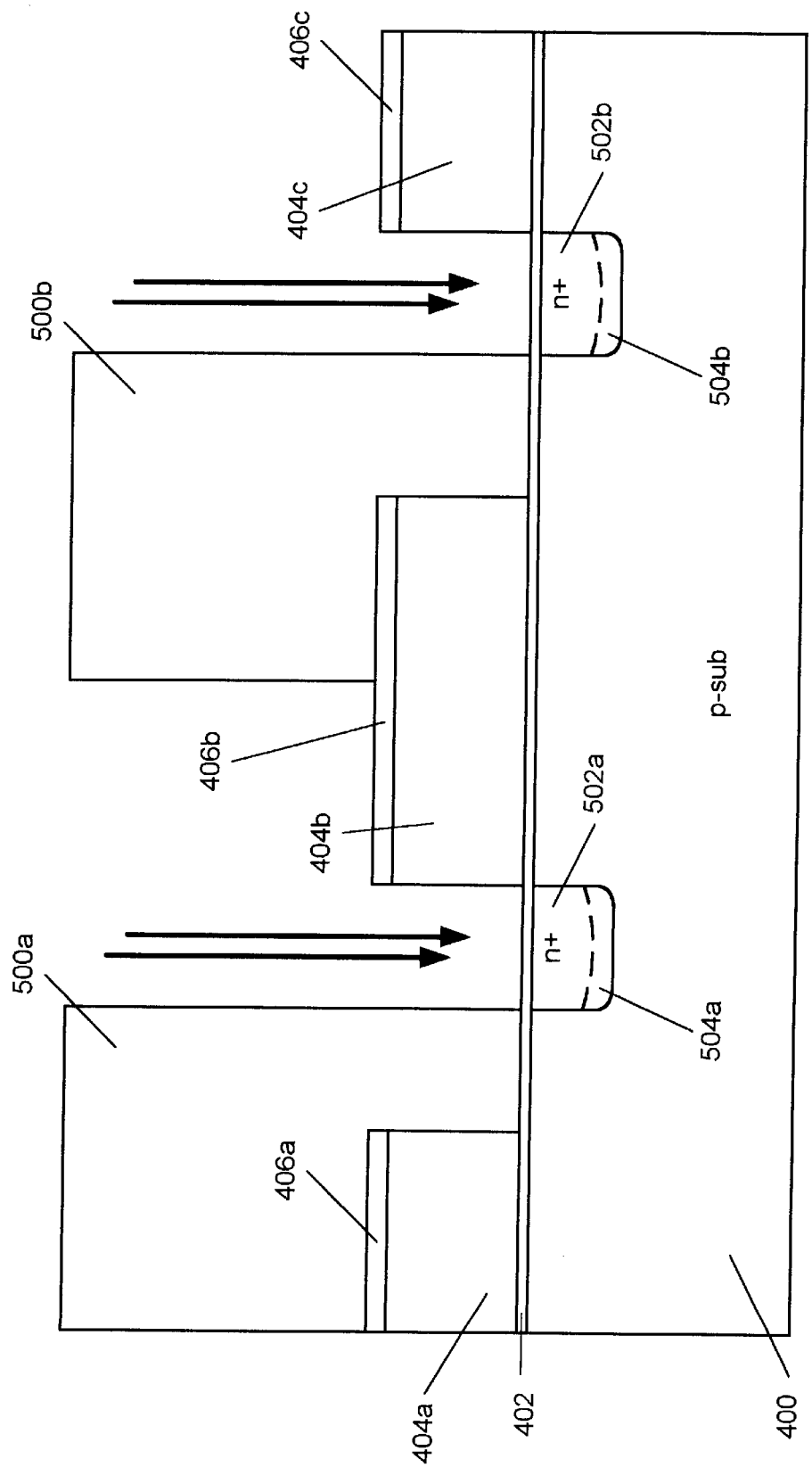

In FIG. 5, photo-resist masks 500a–b have been placed over the source side of the floating gate strips 404a–b, respectively. Next an n-type dopant implant is used to form a drain for each of the floating gate strips 404b–c. The diffusion may comprise arsenic and optionally phosphoric ions to form respectively upper $n^+$ type diffusions 502a–b and lower $n^-$ type diffusions 504a–b. The faster diffusing phosphorous ions more deeply penetrate substrate 400 thereby forming lower $n^-$ diffusions 504a–b subjacent to upper $n^+$ type diffusions 502a–b. The implant dose for the $n^+$ implant is approximately $4–9 \times 10^{15}$ ions/cm². The implant dose for the $n^-$ implant is approximately $2–4 \times 10^{14}$ ions/cm². The drain diffusion for floating gate strip 404b is formed from diffusions 502a and 504a. The drain diffusion for floating gate strip 404c is formed from diffusions 502b and 504b.

Figure 6:
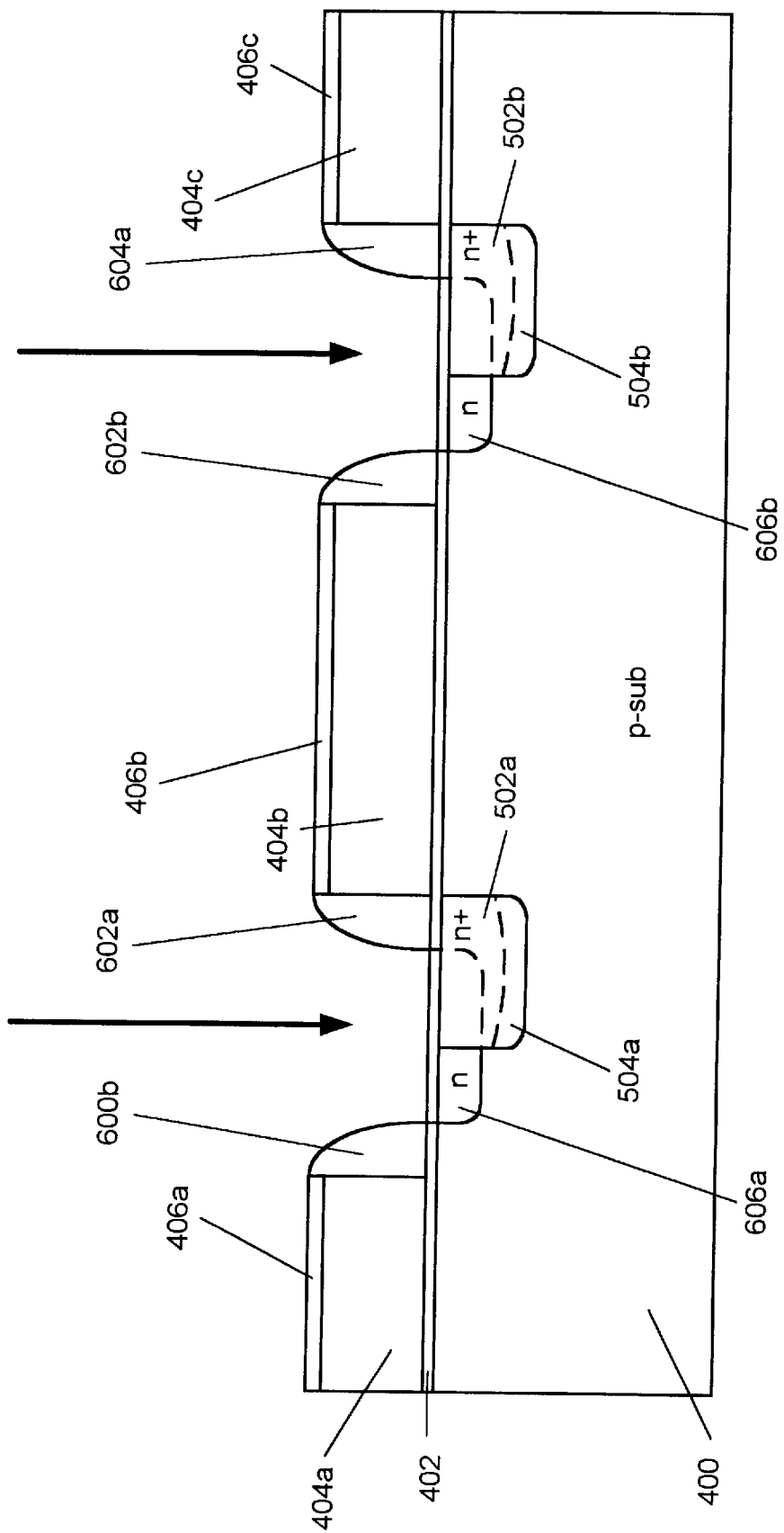

As shown in FIG. 6, sidewalls 600b, 602a–b, and 604a have been formed on the sides of the floating gate strips. Sidewall 600b has been formed on the source side of floating gate strip 404a. Sidewalls 602a–b have been formed on the drain and source sides respectively of floating gate strip 404b. Sidewall 604a has been formed on the drain of floating gate strip 404c. The sidewalls comprise a dielectric material in contact with the floating gate strips. The sidewall formation process involves the Chemical Vapor Deposition (CVD) deposition of an oxide layer having a thickness corresponding to the desired width of the sidewalls. The CVD deposition is followed by an anisotropic etch in which all portions of the oxide layer except the sidewalls are removed. In a preferred embodiment, the sidewalls are 0.05 $\mu$m to 0.10 $\mu$m in width. Next a n-type dopant is implanted in the region between the sidewalls. The implant dose for the n-type implant is approximately $2–3 \times 10^{15}$ ions/cm². A n-type diffusion 606a is formed between sidewall 600b and 602a. A n-type diffusion 606b is formed between sidewall 602b and sidewall 604a. The separation of the source and drain diffusions from the floating gate core of these source and drain diffusions determine, in the later discussed thermal oxide formation and drive-in step the relative extent to which these diffusions overlap and underlap the floating gate strips.

Figure 7:
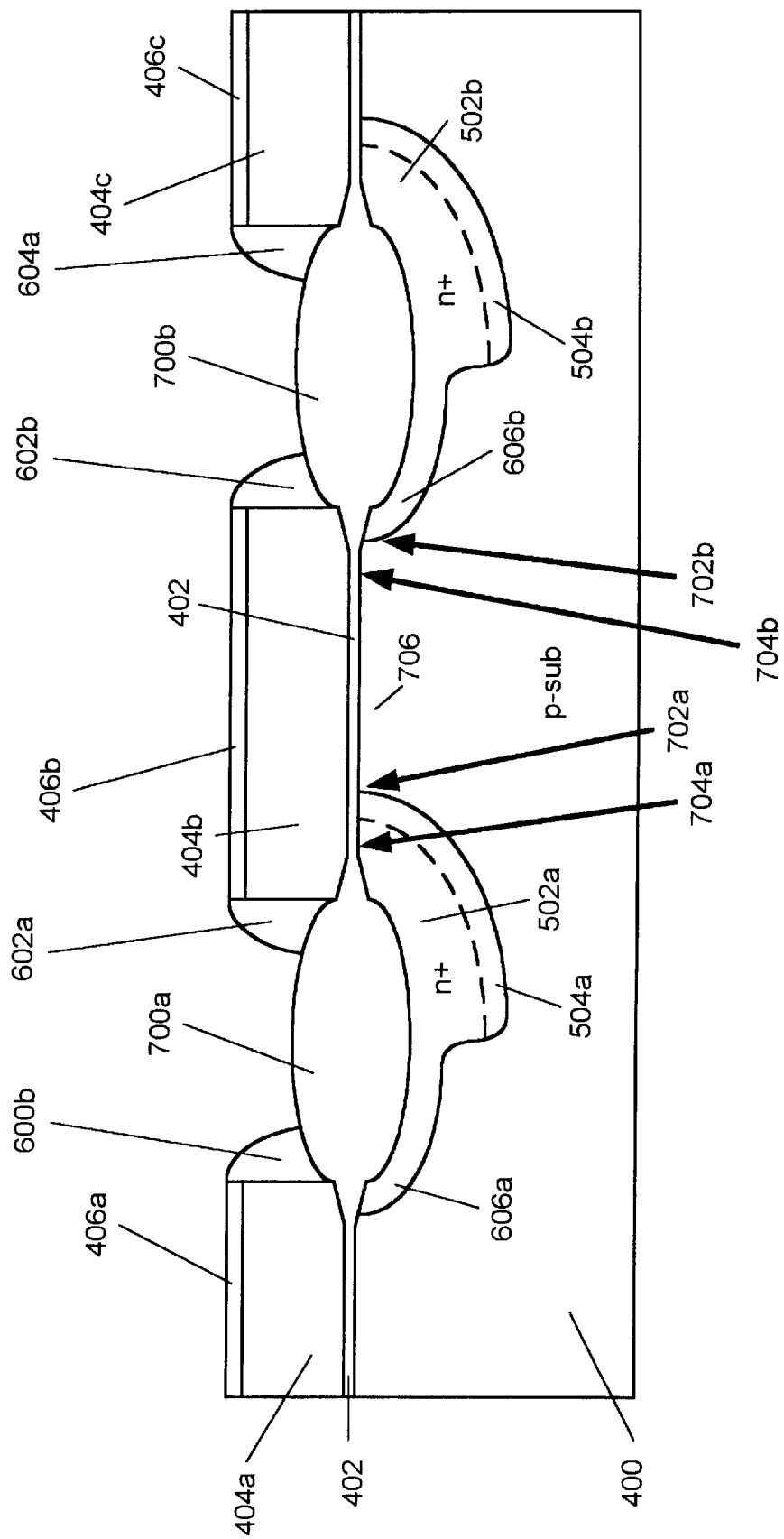

In FIG. 7, a thermal oxidation of the exposed portions of tunneling oxide 402 between the sidewalls is performed. As a result, thermal oxide regions 700a–b have been formed over the buried source and drain diffusions. Thermal oxide region 700a has been formed over source diffusion 606a and drain diffusions 502a and 504a. Thermal oxide region 700b has been formed over source diffusion 606b and drain diffusions 502b and 504b. The thermal oxide formation process provides two effects. First, symmetric birds'beak encroachments are formed on the source and drain side of the floating gate strips. As referenced, a bird's beak encroachment 704a is formed on the drain side of floating gate strips 404b and 404a. A symmetric bird's beak encroachment 704b is formed on the source side of floating gate strip 404b. Secondly, during the formation of the oxide regions the source and drain diffusions are driven into the substrate both vertically and horizontally. The extent of the drive-in is a function of the sidewall width, the thermal oxidation temperature and thermal oxidation time.

The thermal oxide formation process results in drain diffusions 502a and 504a overlapping 702a the bird's beak encroachment 704a. The junction depth of the n-type source and $n^+$ drain diffusions are all about 0.2–0.3 $\mu$m after the thermal drive-in. The optional $n^-$ drain diffusion is about 0.3–0.4 $\mu$m after the thermal drive-in. On the source side, the source diffusion 606b underlaps 702b, the bird beak encroachment 704b. The overlap on the drain side provides a path through the thin tunneling dielectric 402 for the passage of electrons to and from floating gate strip 404b. Conversely, the underlapped source diffusion is separated from the floating gate strip by the relatively thick oxide of the symmetric bird's beak encroachment 704b. This thicker oxide reduces the amount of tunneling on the source side of the cell. A channel region 706 is defined between the source and drain regions of the cell.

Figure 8:
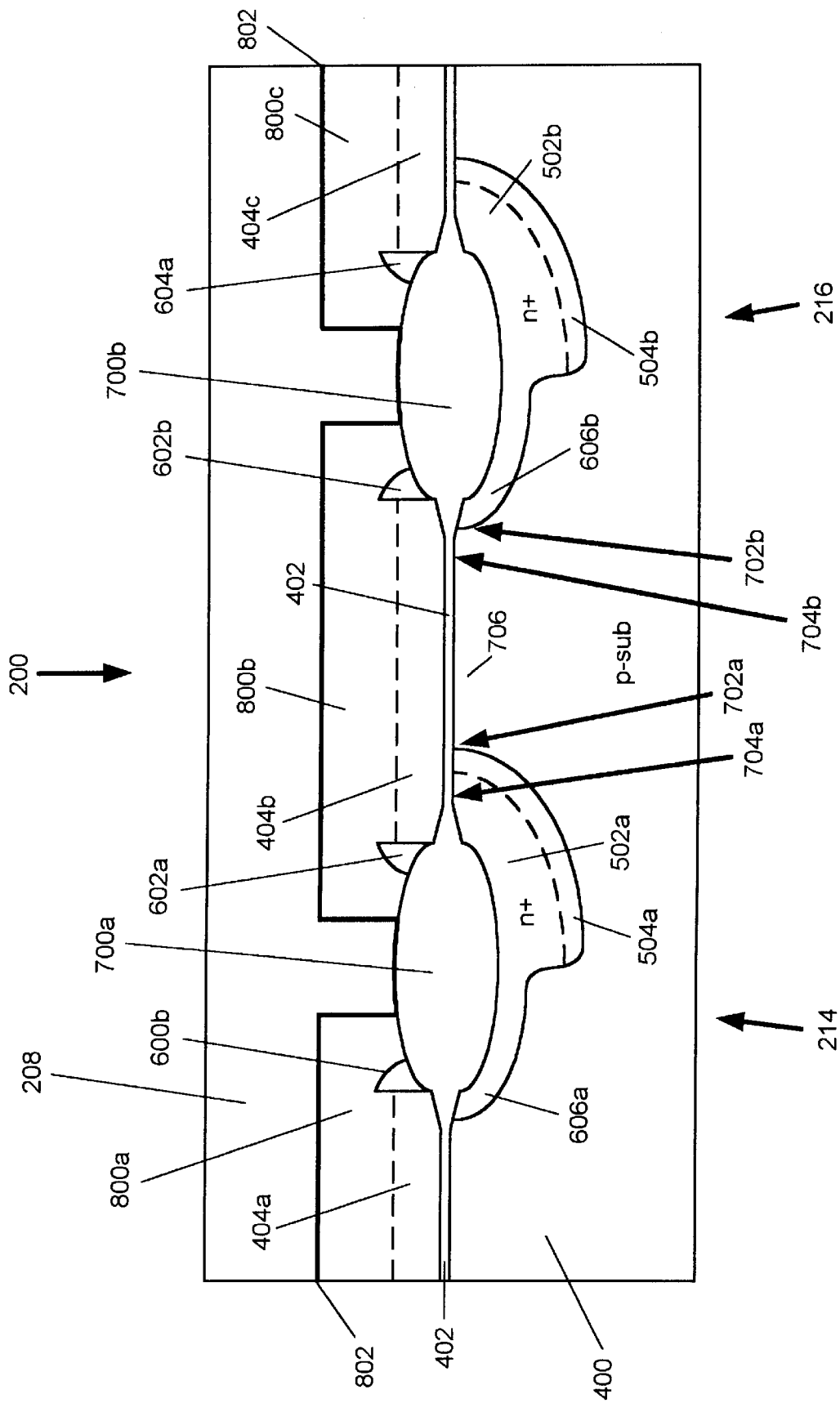

As shown in FIG. 8, the formation of the memory cells of which transistor 200 is referenced is completed. Floating gate coupling caps 800a–c, comprising polysilicon, are deposited above floating gate strips 404a–c, respectively. Each coupling cap increases the gate coupling ratio of the transistor. An interpoly dielectric 802, e.g. oxide-nitride-oxide (ONO) covers the floating gate coupling caps and the field oxide regions 700a–b, and insulates these from the poly silicon layer from which the control gate/ word-line will be formed. The formation of the memory cells is completed with the patterning and etching of the poly silicon layer to form word-line 208, and of the floating gate strips 404a–c to form individual single transistor memory cells. As referenced, transistor 200 comprises word-line/control gate 208 floating gate strip 404b, floating gate coupling cap 800b, floating gate sidewalls 602a–b and source and drain regions 606b and 502a, 504a, respectively. Virtual ground buried bit-line 214 comprises source diffusion 606a and buried drain diffusions 502a and 504a. Buried bit-line 216 comprises buried source diffusion 606b and buried drain diffusions 502b and 504b.

Figure 9:
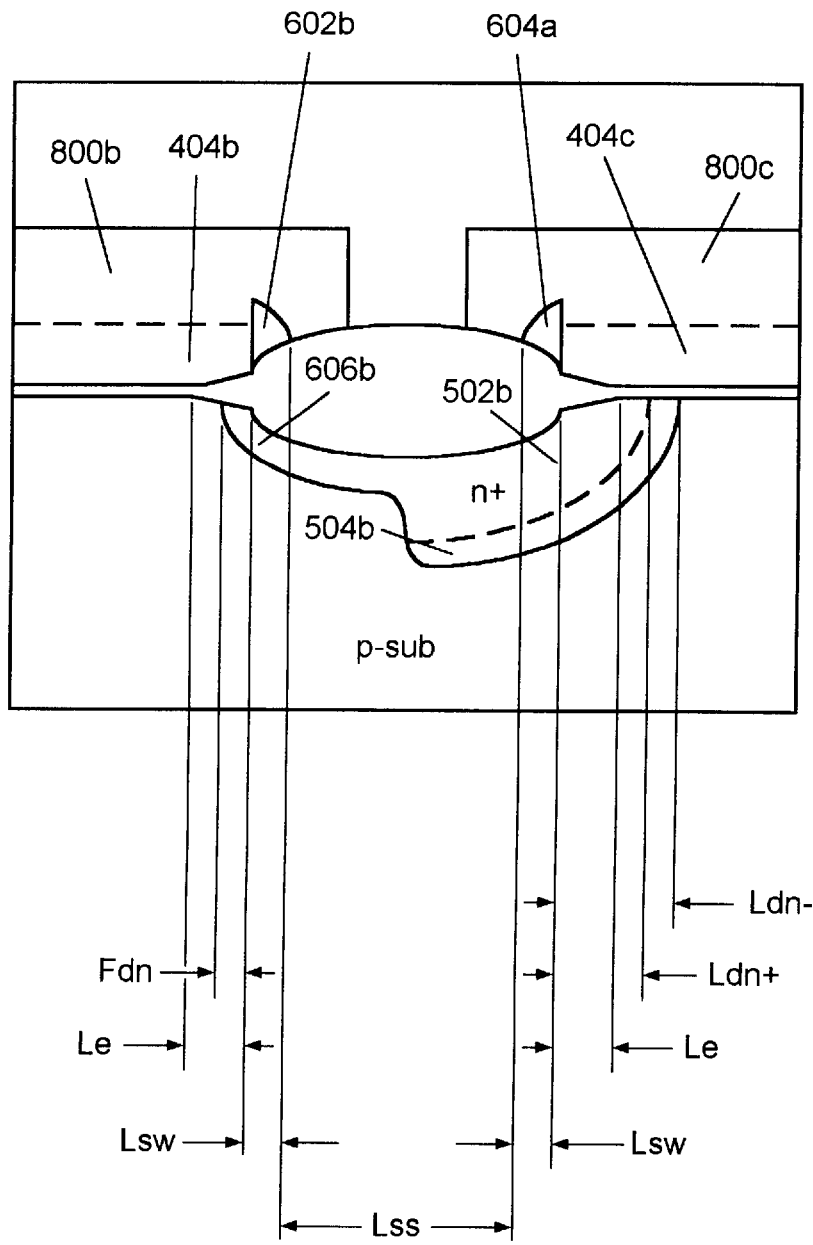
FIG. 9 illustrates dimensions for sidewall, diffusion, and bird's beak encroachments shown in FIG. 8.

FIG. 9 illustrates dimensions for sidewall, diffusion, and bird's beak encroachments shown in FIG. 8. Floating gate cores 404b–c are shown with respective adjacent sidewalls 602b and 604a. The separation of the sidewalls is referenced as Lss. The width of the sidewalls is referenced as Lsw. The length of the bird's beak encroachments beneath floating gate cores, measured from the edge of each floating gate core, is referenced as Le. The length of the n-type source diffusion beneath the floating gate core, measured from the source side of each floating gate core, is referenced as Fdn. The length of the $n^+$ drain diffusion beneath the floating gate core, measured from the drain side of each floating gate core, is referenced as $Ldn^+$. The length of the $n^-$ drain diffusion beneath the floating gate core, measured from the drain side of each floating gate core, is referenced as $Ldn^-$.

The lateral diffusion drive in length for the source and drain is equivalent. On the drain side the lateral diffusion drive in length is measured from the edge of the floating gate core 404c, as referenced in FIG. 9. On the source side the lateral diffusion length is measured from the edge of sidewall 602b. As described above in connection with FIG. 6, the n-type source diffusion is implanted after the formation of the sidewalls. Therefore the source side diffusion drive in length Ldn is the sum of the sidewall width Lsw and the length of the source diffusion beneath the floating gate core Fdn. The drive in diffusion length can be controlled by thermal oxidation time and temperature. Longer thermal times and lower temperatures correspond to longer bird's beak encroachments Le and shorter source and drain diffusion drive in lengths, Ldn and Ldn$^+$. Shorter thermal times and higher temperatures correspond to shorter bird's beak encroachments Le and longer source and drain diffusion drive in lengths, Ldn and Ldn$^+$.

Representative dimensions for a cell structure as shown in FIG. 9 with floating gate coupling cap 800b–c, and the optional n– drain diffusion 504b are as follows. The floating gate core width is 0.35 $\mu$m. The center-to-center spacing between floating gate cores 404b–c at 0.85 $\mu$m. The sidewall separation Lss is 0.32 $\mu$m. The sidewall width Lsw is 0.09 $\mu$m. The length of the bird's beak encroachments Le is 0.06 $\mu$m. The length of the n-type source diffusion Fdn is 0.03 $\mu$m. The source side diffusion drive in length Ldn is 0.12 $\mu$m. The length of the n$^+$ drain diffusion Ldn$^+$ is 0. 12 $\mu$m. The length of the n$^-$ is 0.13 $\mu$m. Device dimensions can be reduced further if the optional n$^-$ implant 504b and/or the floating gate core coupling caps 800b–c are omitted.

As described above, the transistor having overlapping and underlapping diffusion regions can be utilized to form a memory array having a high density, high programming speed and without programming disturb. The transistor may be fabricated using standard diffusion techniques, rather than requiring large angle tilt ion implantation with the associated reduction in the throughput.

The foregoing description of a preferred embodiment of the invention has been presented for purposes of illustration and description. It is not intended to limit the invention to the precise forms disclosed. Obviously, many modifications and equivalent arrangements will be apparent to practitioners skilled in this art. Therefore, persons of ordinary skill in this field are to understand that all such equivalent structures are to be included within the scope of the following claims and their legal equivalents.

What is claimed is:

1. A method for manufacturing a virtual ground memory cell array having nonvolatile asymmetric memory cells, the method comprising the steps of:
   forming a dielectric covering a semiconductor substrate characterized by a first conductivity type;
   forming a first and second column of floating gate cores on the dielectric;
   implanting a first dopant along a first dopant strip, the first dopant strip aligned adjacent the second column and displaced from the first column, the first dopant having a second conductivity type opposite the first conductivity type;
   forming floating gate sidewalls in contact with the floating gate cores and defining between them a second dopant strip;
   implanting a second dopant in the second dopant strip, the second dopant having the second conductivity type;
   forming a thermal oxide between the first and second column of floating gate cores such that an oxide encroachment is formed below each floating gate core of the first and second column and the first dopant is separated from the second column of each floating gate core by the dielectric and the second dopant is separated from the first column of each floating gate core by the oxide encroachment; and
   completing formation of control gate dielectric and control gates.

2. The method for manufacturing a virtual ground memory cell array of claim 1, wherein:
   the step of implanting a first dopant along a first dopant strip further comprises:
      diffusing the first dopant and a third dopant wherein the third dopant is characterized by a greater diffusion rate than the first dopant.

3. The method for manufacturing a virtual ground memory cell array of claim 1, wherein:
   said step of implanting said first dopant along said first dopant strip, further comprises:
      covering each floating gate core of the first and the second column with silicon nitride;
      patterning a mask over the silicon nitride, over the dielectric adjacent the first column, and exposing the dielectric adjacent the second column;
      diffusing the first dopant along the first dopant strip; and
      removing the patterned mask after said diffusing.

4. The method for manufacturing a virtual ground memory cell array of claim 2, wherein:
   the step of implanting the first dopant along the first dopant strip, further comprises:
      covering the floating gate cores of the first and the second column with silicon nitride;
      patterning a mask over the silicon nitride, over the dielectric adjacent the first column, and exposing the dielectric adjacent the second column;
      diffusing the first and the third dopant along the first dopant strip; and
      removing said patterned mask after said diffusing.

5. The method for manufacturing a virtual ground memory cell array of claim 1, further comprising the steps of:
   using silicon oxide for the dielectric;
   providing a layer of polysilicon to form the first and second column of floating gate cores;
   using a dielectric material to form the floating gate sidewalls; and
   implanting the first and the second dopant strips with an n-type material to form the second conductivity type.

6. The method for manufacturing a virtual ground memory cell array of claim 2, further comprising the steps of:
   using silicon oxide for the dielectric;
   providing a layer of polysilicon to form the first and second column of floating gate cores;
   using a dielectric material to form the floating gate sidewalls;
   implanting the first dopant strip with a first dopant comprising arsenic and a third dopant comprising phosphorus; and
   implanting the second dopant strip with an n-type material to form the second conductivity type.

\* \* \* \* \*